US010666339B2

(12) United States Patent
Nammi

(10) Patent No.: US 10,666,339 B2
(45) Date of Patent: *May 26, 2020

(54) FORWARD ERROR CORRECTION CODE SELECTION IN WIRELESS SYSTEMS

(71) Applicant: AT&T INTELLECTUAL PROPERTY I, L.P., Atlanta, GA (US)

(72) Inventor: SaiRamesh Nammi, Austin, TX (US)

(73) Assignee: AT&T INTELLECTUAL PROPERTY I, L.P., Atlanta, GA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/265,914

(22) Filed: Feb. 1, 2019

(65) Prior Publication Data
US 2019/0181937 A1 Jun. 13, 2019

Related U.S. Application Data

(63) Continuation of application No. 15/285,453, filed on Oct. 4, 2016, now Pat. No. 10,243,638.

(51) Int. Cl.
H04B 7/06 (2006.01)
H04L 1/00 (2006.01)
(Continued)

(52) U.S. Cl.
CPC ........ H04B 7/0632 (2013.01); H03M 13/353 (2013.01); H04B 7/0408 (2013.01);
(Continued)

(58) Field of Classification Search
CPC ... H04B 7/0632; H04B 7/0408; H04L 1/0041; H04L 1/0009; H04L 1/16; H03M 13/353;
(Continued)

(56) References Cited

U.S. PATENT DOCUMENTS 6,208,626 B1 3/2001 Brewer
7,346,832 B2 3/2008 Richardson et al.
(Continued)

FOREIGN PATENT DOCUMENTS

CA 2 053 851 C 9/1997
EP 0 794 631 A2 9/1997
(Continued)

OTHER PUBLICATIONS

Jaber et al., "5G Backhaul Challenges and Emerging Research Directions: A Survey", URL: http://ieeexplore.ieee.org/stamp/stamp.jsp?arnumber=7456186, IEEE Access, vol. 4., Apr. 20, 2016, pp. 1743-1766.

(Continued)

Primary Examiner — Omar J Ghowrwal
(74) Attorney, Agent, or Firm — Amin, Turocy & Watson, LLP

(57) ABSTRACT

Selection of a forward error correction (FEC) code based on a wireless network characteristic is disclosed. The selection can facilitate changing from a first FEC code to a second FEC code in response to the wireless network characteristic changing. The selection can facilitate selection of FEC codes for user equipments (UEs) of a plurality of UEs, wherein the FEC codes can be the same or different FEC codes and can be employed among the plurality of UEs contemporaneously. Selected FEC codes can be applied to uplink and/or downlink channels. An embodiment can select an FEC code based on UE location. An embodiment can select an FEC code based on UE proximity to another device. An embodiment can select an FEC code based on channel signal to noise ratio. An embodiment can select an FEC code based on UE capability. An embodiment can determine a FEC code selection model.

20 Claims, 10 Drawing Sheets

(51) Int. Cl.
*H03M 13/35* (2006.01)
*H04L 1/16* (2006.01)
*H04B 7/0408* (2017.01)
*H03M 13/29* (2006.01)
*H03M 13/11* (2006.01)
*H04W 88/08* (2009.01)
*H04W 88/02* (2009.01)

(52) U.S. Cl.
CPC ......... *H04L 1/0009* (2013.01); *H04L 1/0041* (2013.01); *H04L 1/16* (2013.01); *H03M 13/1102* (2013.01); *H03M 13/2957* (2013.01); *H04W 88/02* (2013.01); *H04W 88/08* (2013.01)

(58) Field of Classification Search
CPC ......... H03M 13/2957; H03M 13/1102; H04W 88/08; H04W 88/02
See application file for complete search history.

(56) References Cited

U.S. PATENT DOCUMENTS

| | | | |
|---|---|---|---|
| 7,389,464 | B2 | 6/2008 | Jeong et al. |
| 7,664,008 | B2 | 2/2010 | Stolpman et al. |
| 7,747,929 | B2 | 6/2010 | Kyung et al. |
| 7,783,316 | B1 | 8/2010 | Mitchell |
| 7,802,164 | B2 | 9/2010 | Hong et al. |
| 7,987,410 | B2 | 7/2011 | Hedberg et al. |
| 8,429,503 | B2 | 4/2013 | Okamura et al. |
| 8,656,247 | B2 | 2/2014 | Kyung et al. |
| 8,667,360 | B2 | 3/2014 | Motwani |
| 8,826,102 | B2 | 9/2014 | Liu et al. |
| 9,118,353 | B2 | 8/2015 | Eroz et al. |
| 9,369,883 | B2 | 6/2016 | Giffin et al. |
| 10,243,638 | B2 * | 3/2019 | Nammi ............... H04B 7/0632 |
| 10,389,487 | B2 * | 8/2019 | Nammi |
| 2006/0059401 | A1 | 3/2006 | Ko |
| 2006/0218459 | A1 | 9/2006 | Hedberg |
| 2007/0014331 | A1 | 1/2007 | Eldon et al. |
| 2008/0091986 | A1 | 4/2008 | Nimbalker et al. |
| 2010/0031125 | A1 | 2/2010 | Shen et al. |
| 2010/0070822 | A1 | 3/2010 | Leung et al. |
| 2010/0251069 | A1 | 9/2010 | Sun et al. |
| 2010/0329308 | A1 | 12/2010 | Kim et al. |
| 2011/0026623 | A1 | 2/2011 | Srinivasa et al. |
| 2012/0216099 | A1 | 8/2012 | Jeong et al. |
| 2012/0252462 | A1 | 10/2012 | Fahldieck |
| 2013/0097474 | A1 | 4/2013 | Hwang et al. |
| 2014/0195873 | A1 | 7/2014 | Ishida et al. |
| 2015/0003277 | A1 | 1/2015 | Wellington |
| 2015/0117269 | A1 | 4/2015 | Navalekar et al. |
| 2015/0319272 | A1 | 11/2015 | Varadarajan et al. |
| 2016/0099796 | A1 | 4/2016 | Yang et al. |
| 2016/0233980 | A1 | 8/2016 | Pantelias et al. |
| 2016/0315733 | A1 | 10/2016 | Murakami et al. |
| 2017/0295607 | A1 | 10/2017 | Prasad |

FOREIGN PATENT DOCUMENTS

| | | |
|---|---|---|
| EP | 0 863 682 A1 | 9/1998 |
| EP | 1 189 379 A1 | 3/2002 |
| EP | 1 593 226 A1 | 11/2005 |
| WO | 2004/107185 A1 | 12/2004 |
| WO | 2009/102190 A2 | 8/2009 |
| WO | 2016/045391 A1 | 3/2016 |
| WO | 2016/095964 A1 | 6/2016 |
| WO | 2016/140292 A1 | 9/2016 |
| WO | 2017/014846 A1 | 1/2017 |

OTHER PUBLICATIONS

Lodro et al., "Device-To-Device Communication in LTE-A and Its Prospects for 5G Cellular Communication", URL: https://www.researchgate.net/profile/Mir_Lodro/publication/272293566_Device-To-Device_Communication_in_LTEA_and_its_Prospects_for_5G_Cellular Communication/links/54e0fcec0cf24d184b0f861e.pdf, Feb. 11, 2015, 50 pages.

Paul et al., "Implementation and Analysis of forward error correction decoding for Cloud-RAN systems", IEEE International Conference on Communication Workshop (ICCW). IEEE, 2015, URL : https://pdfs.semanticscholar.org/5362/679d60c36ffid3af7f91607ac39254069d43b.pdf, pp. 2708-2713.

Wübben et al., "Benefits and Impact of Cloud Computing on 5G Signal Processing", URL: https://www.researchgate.net/profile/Dirk Wuebben/publication/270506903 Benefits_and_Impact_of_Cloud_Computing_on_5G Signal_Processing/links/54abe3bb0cf2bce6aa1dc60f.pdf, Oct. 15, 2014, pp. 35-44.

Studer et al., "Simulator for LDPC decoding in IEEE 802.11n", Cornell Univ., csl.cornell.edu, Jan. 3, 2015, retrieved via Internet Archive Wayback Machine http://web.archive.org/web/20150103082603/http://www.csl.cornell.edu/~studer/software_ldpc.html. retrieved on Nov. 29, 2016, 2 pages.

Non-Final Office Action received for U.S. Appl. No. 15/285,453 dated Mar. 5, 2018, 36 pages.

International Search Report and Written Opinion received for PCT Application No. PCT/US2017/052577 dated Dec. 15, 2017, 15 pages.

Final Office Action received for U.S. Appl. No. 15/285,453 dated Jul. 6, 2018, 24 pages.

Non-Final Office Action received for U.S. Appl. No. 15/377,943 dated Jul. 11, 2018, 29 pages.

Notice of Allowance received for U.S. Appl. No. 15/285,453 dated Nov. 2, 2018, 29 pages.

Non-Final Office Action received for U.S. Appl. No. 16/292,500 dated Dec. 30, 2019, 26 pages.

* cited by examiner

FORWARD ERROR CORRECTION CODE SELECTION IN WIRELESS SYSTEMS

RELATED APPLICATION

The subject application is a continuation of, and claims priority to, U.S. patent application Ser. No. 15/285,453, (now U.S. Pat. No. 10,243,638), filed 4 Oct. 2016, and entitled "FORWARD ERROR CORRECTION CODE SELECTION IN WIRELESS SYSTEMS," the entirety of which application is hereby incorporated by reference herein.

TECHNICAL FIELD

The disclosed subject matter relates to selection of a forward error correction code in a wireless system. More specifically, this disclosure relates to selection of a forward error correction code in a wireless system based on a wireless system parameter to enable improvement of wireless system performance over conventional wireless system technologies.

BACKGROUND

By way of brief background, the continued growth of wirelessly connected devices has created an increasingly crowded radio frequency (RF) spectrum. Conventional wireless systems generally adopt a fixed forward error correction (FEC) code scheme for communication of data between mobile devices (UEs) and radio access network (RAN) devices. FEC codes are well known and have been employed in wireless systems for many years. In many conventional wireless systems, a specific FEC code is adopted for communication between a UE and a RAN device. In an aspect, this allows the UE to receive the correct data from a RAN device without relying on a retransmit request. It is generally accepted that some FEC codes work better than other FEC codes based on characteristics of the communication channel, e.g., distance between a UE and a RAN device, interference between a UE and a RAN device, geographic topography between a UE and a RAN device, etc. As such, in some circumstances, an adopted FEC code in a conventional wireless system can perform better in some circumstances and more poorly in other circumstances. As a result, communication efficiency in a conventional wireless system can be affected. As an example, where a UE is near a, eNodeB device, wherein the term eNodeB can encompass a NodeB, an eNodeB, an access point (AP), etc., a low density parity check (LDPC) FEC code can perform better than other FEC codes, however, as the UE moves away from the eNodeB, the LDPC FEC code can perform more poorly than other FEC codes. This performance differential can reduce wireless network efficiency where only a LDPC code is employed by the wireless system.

DETAILED DESCRIPTION

Figure 1:
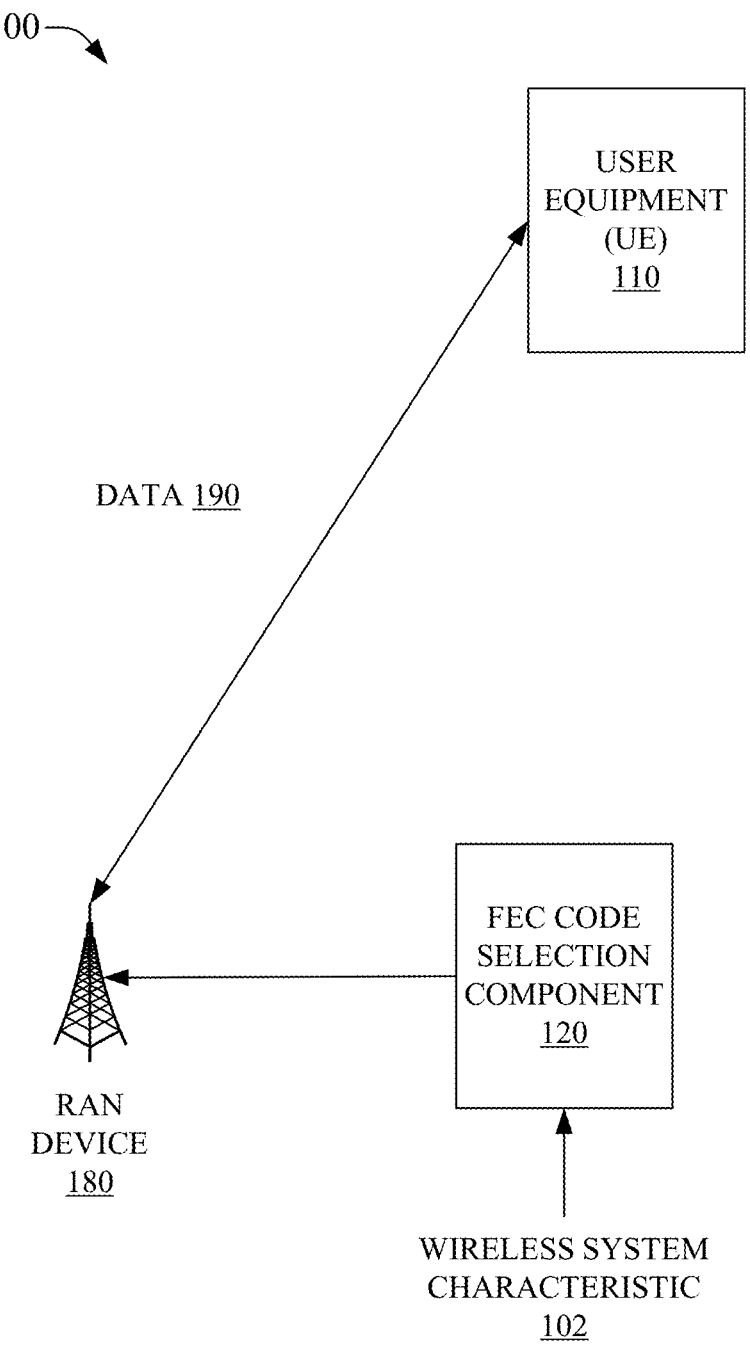
FIG. 1 is an illustration of an example system that can enable forward error correction code selection in a wireless system in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

An increasingly crowded RF spectrum and demand for an ever faster and more efficient communications network is pushing for improvements in wireless systems, e.g., wireless network carrier systems, etc. Conventional wireless systems generally designate a fixed forward error correction (FEC) code scheme for communication of data between mobile devices (UEs) and radio access network (RAN) devices of the wireless system. A variety of FEC codes are well known and wireless carriers have adopted different FEC codes for use in their wireless systems based on various business goals, however, these conventional wireless systems typically rely on an adopted FEC code in large portions of the coverage areas provided by their wireless systems. Typically, a wireless system does not employ a plurality of FEC codes concurrently between different user equipments accessing a RAN device, or changing a FEC code for a single UE as conditions of the communication channel change. Rather, in many conventional wireless systems, a specific FEC code is adopted for communication between a UE and a RAN device and that FEC code is adhered to despite changes in the characteristics of the wireless network or changes in the communication channel.

An FEC code generally enables a UE to determine when transmitted data is accurate, especially when data transmission occurs over unreliable or noisy communications links that can degrade transmitted data. Under typical FEC code schemes, some redundant data is transmitted with error-correcting code that facilitates detection, and often correction, of flawed data by the receiving user equipment. This can occur without needing to request a retransmission and, therefore, can allow error correction without use of a reverse channel between the user equipment and the data source transmitter. FEC code types can include, but are not limited to low density parity check (LDPC), turbo codes, polar codes, Hadamard codes, Reed-Muller codes, long code, etc. The disclosed subject matter can generally facilitate selection and use of nearly any FEC code and is expressly not limited to the particular FEC codes named herein.

It is generally accepted that a wireless system characteristic can dictate which FEC codes will work most effectively for a given value of that characteristic. As an example, a distance between devices, noise or interference on a communication channel, geography or topography in a wireless network service area, etc., can each influence the performance of a FEC coding scheme applied by the wireless system operator. In some circumstances, a single adopted FEC code in a conventional wireless system can experience performance changes as the characteristics of the wireless system, communication channel, etc., change. As a result, communication efficiency in a conventional wireless system can be affected. As an example, where a UE is proximate to an eNodeB device, a LDPC code can perform better than other FEC codes, however, as the UE moves away from the eNodeB, the LDPC code can perform more poorly than other FEC codes. This performance differential can reduce wireless network efficiency where only an LDPC code is employed by the wireless system. As another example, where an eNodeB is supporting two UEs, one UE close and the other UE far from the eNodeB, the use of only an LDPC code can result in good performance for the near UE and poor performance for the far UE. Moreover, conventional adoption of a single FEC code can affect support for UEs that do not support the adopted FEC code. This can result in conventional wireless systems employing a 'lowest common denominator' FEC code, e.g., an FEC code that is most broadly useable by UE chipsets, that gives acceptable performance over the greatest amount of coverage area, etc., even where the adoption of that particular FEC code results in lesser performance for some communication channels or for some UEs. It is generally desirable to allow for use of a plurality of FEC code schemes to improve the performance of the wireless system by allowing different FEC codes to be used concurrently for different UEs, e.g., contemporaneously, simultaneously, the use of the different FEC codes has at least some overlap in time among the different UEs, etc., to facilitate dynamic reselection to a different FEC code in response to changes in a communication channel, to support different UEs that can support different FEC code schemes, etc.

In a typical provisioning of a communication channel between a UE and an eNodeB, a pilot or reference signal, which can be beamformed or non-beamformed, can be received by a UE. The UE can then determine a channel estimate and parameter(s) for reporting channel state information (CSI). The CSI report can, for example, comprise channel quality indicator information (CQI), preceding matrix index information (PMI), rank information (RI), sub-band index data, beam index data, etc. A CSI report can be sent to an eNodeB, for example, via a feedback channel. The UE can be scheduled to the eNodeB based on CSI information, e.g., from the CSI report. An eNodeB can send a scheduling parameter to a UE in a downlink control channel to facilitate further transfer of data between the eNodeB and the UE. Generally, CQI is tabularized in a CSI report to facilitate reporting of a CQI index to the UE. As an example, a CQI table comprising CQI indices can be:

| CQI index | modulation | code rate × 1024 | efficiency |
|---|---|---|---|
| 0 | | out of range | |
| 1 | QPSK | 78 | 0.1523 |
| 2 | QPSK | 120 | 0.2344 |
| 3 | QPSK | 193 | 0.3770 |
| 4 | QPSK | 308 | 0.6016 |
| 5 | QPSK | 449 | 0.8770 |
| 6 | QPSK | 602 | 1.1758 |
| 7 | 16QAM | 378 | 1.4766 |
| 8 | 16QAM | 490 | 1.9141 |
| 9 | 16QAM | 616 | 2.4063 |
| 10 | 64QAM | 466 | 2.7305 |
| 11 | 64QAM | 567 | 3.3223 |
| 12 | 64QAM | 666 | 3.9023 |
| 13 | 64QAM | 772 | 4.5234 |
| 14 | 64QAM | 873 | 5.1152 |
| 15 | 64QAM | 948 | 5.5547 |

Where the CQI can be updated, based on characteristics of the wireless system or communication channel, scheduling of the UE via the eNodeB can allow for selection of different FEC codes among different UEs in the service are of the eNodeB, reselection of FEC codes for a UE based on changes in a channel condition, use of FEC codes related to the limitations of different UEs, etc. In an aspect, configuring the FEC code, and the corresponding CQI table, can be performed for downlink transmission and/or uplink transmission. In another aspect, the CQI table/data can comprise different code rate granularities in accordance with the corresponding FEC code. As an example, a turbo code FEC coding CQI table/data can comprise CQI indices that favor higher data rates, e.g., more higher data rate turbo code indices than lower data rate turbo code indices, in comparison to a LDPC FEC coding CQI table/data that can favor lower data rates, e.g., fewer higher data rate LDPC indices than lower data rate LDPC indices.

While in some embodiments, each FEC code can have a corresponding CQI table/data, in some embodiments, a single CQI table/data can represent multiple FEC codes in a single CQI table/data. As such, where embodiments have a 1-to-1 FEC code-to-CQI table/data relationship, when an FEC code for a communication channel is adapted, a different CQI table/data can be employed for coding data transmitted on the communication channel. However, in some embodiments where the CQI table/data embodies a plurality of FEC codes, a the selection of FEC codes represented in the single CQI table/data can facilitate a UE switching between different FEC coding by selecting different CQI table index from the single CQI table/data. As an example, a CQI table according to these embodiments can have both turbo code and LDPC entries in the same table/data. Moreover, the CQI table/data can comprise multiple turbo code FEC code rates and/or multiple LDPC FEC code rates in the same CQI table/data. Accordingly, a UE can then select, for example, a LDPC FEC code rate that can be the same as a turbo code FEC code rate but where the LDPC FEC code rate is desirable over the turbo code FEC code rate for another reason, such as robustness. In an aspect, the disclosed subject matter can have embodiments that combine these aspects, such that some FEC codes can have a separate CQI table/data while other FEC codes are represented in a combined CQI table/data. As an example, Polar FEC code can have a separate CQI table and another CQI table/data can comprise both LDPC and turbo code FEC code entries. As an extension of these embodiments, some CQI table/data overlap can occur in some embodiments, for example, there can be a first turbo code FEC CQI table/data and a second CQI table/data that comprises LDPC entries and turbo code entries in the second CQI table/data and wherein selection of turbo code FEC code can employ either the first CQI table/data or the second CQI table/data.

Wherein the performance of different FEC code schemes can be dissimilar for different code rates and/or for different modulation schemes, an eNodeB can flexibly schedule FEC codes for a UE to enable the UE to decode a data received by a downlink channel and encode data for uplink data channels according to a selected FEC code, rather than merely adopting a single FEC code for all the code rates and modulation schemes. In an embodiment, link throughput can be enhanced by using a FEC technique selected for given wireless system or communication channel conditions. For example, where Turbo and LDPC are available FEC codes and are defined in corresponding CQI tables, an example Turbo CQI table can define more entries at low code rates and/or low modulation schemes to account for turbo code performing better at low code rates or lower modulation. Similarly, an example LDPC CQI table can define more entries for higher modulation and/or higher code rates. Moreover, where another FEC code is available, a further CQI table can be defined accordingly.

An eNodeB can use characteristics of the wireless system or communication channel to determine an appropriate FEC code and a corresponding CQI table, or other CQI data, for a UE, e.g., performance criteria can be employed to select an FEC code and to access or establish a corresponding CQI table. The eNodeB can configure, or reconfigure, a UE with a selected FEC code for decoding/encoding data on a communication channel and a CQI table, or other CQI data, can be used by the UE for reporting CSI, including CQI, to the network node. Wireless system or communication channel characteristics can include, but are not limited to, UE capabilities, e.g., can the UE support a given FEC code, UE location, geometry of a UE, interference or interferer data, etc. As an example, a UE can signal that it supports only one FEC code and the eNodeB correspondingly can configure the UE with that FEC code and enable access to a corresponding CQI table or other corresponding CQI data. As another example, a UE that can support more than one FEC code can signal accordingly, such that the eNodeB can configure the UE with a first selected FEC code and corresponding CQI table/data and subsequently can select an alternate FEC code and corresponding CQI table/data based on relevant characteristics of the wireless system and/or communication channel, e.g., the FEC code, and CQI table/data, can be dynamically altered in response to changing wireless network conditions.

In some embodiments, a FEC selection model can be determined to facilitate FEC code selection. In an aspect, the FEC selection model can correlate position, location, and/or geometry of a UE with respect to an eNodeB, to indicate a preferred FEC code. As an example, historical measurements of signal to noise for geographic areas served by an eNodeB can be modeled and correlated to FEC codes that provide better performance for specific geographic areas, such that when a UE reports it is at a particular area, the preferred FEC code can be ranked higher than other codes. It will be noted that where the UE also supports the preferred code, the preferred code can then be employed and, where the UE does not support the preferred FEC code, a subsequent FEC code can be employed. In an aspect, FEC codes can be ranked for different locations in the model, e.g., a ranked group of FEC codes can be provided by the model for any given location modeled to facilitate selection based on one or more other characteristics. As such, location data for the UE can be employed to select an FEC code. As an example, when a UE is in a first proximity to an eNodeB associated with higher modulation, the UE can use LDPC/Polar code and corresponding CQI table/data. Similarly, when the UE moves to a second proximity associated with lower modulation, e.g., the cell edge, the eNodeB can configure the UE to use turbo code and corresponding CQI table/data when the UE reports CSI. In some embodiments, an eNodeB can use higher-layer signaling, such as radio resource control (RRC) or media access control (MAC) signaling, etc., to communicate FEC code selection information to a UE.

Various techniques can be employed to determine a UE location, position, or geometry. Moreover, proximity determination can also be employed, in contrast to actual location/position/geometry, to select a FEC code, for example, where a reference signal received power (RSRP) transitions a threshold, e.g., −100 dBm, etc., the eNodeB can infer that the UE is in an area that is associated with, for example, LDPC code, e.g., at a cell edge where LDPC can perform better than turbo code, etc. Similarly, geometry can be employed, in contrast to location/position/proximity, to select a FEC code. As an example, at low geometries, e.g. lower SINR, the UE can be instructed to use a lower modulation accommodating FEC code, such as turbo code, while at high geometries, e.g. higher SINR, the UE can be instructed to employ a FEC code favorable to higher modulation to allow for a higher data rate, e.g., LDPC/Polar. Moreover, the modeling can comprise individual characteristics and/or combinations of various characteristics, e.g., an example FEC selection model can be based on location, proximity, and geometry, can be based on location only, proximity only, geometry only, can be based on a selected characteristic to allow selection of location, proximity, geometry, etc. It will be noted that the subject disclosure is not limited to the aforementioned characteristics and that other characteristics are not presently disclosed only for the sake of clarity and brevity.

As previously asserted, the term eNodeB, unless otherwise explicitly limited, is generally to be interpreted as encompassing any network node serving a UE or connected to another network element serving the UE, e.g., a Node B, base station (BS), multi-standard radio (MSR) radio node, eNodeB, network controller, radio network controller (RNC), base station controller (BSC), relay, donor node controlling relay, base transceiver station (BTS), access point (AP), transmission points, transmission nodes, remote radio unit (RRU), remote radio head (RRH), nodes in a distributed antenna system (DAS), etc. Similarly, the term UE is to be broadly interpreted, except where explicitly limited, to include mobile phones, smartphones, laptop computers, tablet computers, wearable devices, internet of things (IoT) devices, or nearly any other device that can communicate via a wireless system, e.g., a wireless network carrier comprising an over the air link. The disclosed subject matter is operable in single carrier, multi-carrier, or aggregated carrier, etc., environments, including RAT or multi-RAT systems.

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages, and novel features of the disclosed subject matter will become apparent from the following detailed description when considered in conjunction with the provided drawings.

FIG. 1 is an illustration of a system 100, which can facilitate forward error correction code selection in a wireless system in accordance with aspects of the subject disclosure. System 100 can comprise user equipment (UE) 110. UE 110 can be a mobile device such as a cellular phone, smartphone, tablet computer, laptop computer, etc. UE 110 can be communicatively coupled to radio access network (RAN) device 180. RAN 180 can comprise, or be coupled to, a NodeB, eNodeB, or a radio or transmitter/receiver, etc., of a NodeB/eNodeB, a base station, access point (AP), femtocell, picocell, etc. UE 110 can send and/or receive data 190 via a wireless link to RAN device 180. Data 190 can comprise provisioning data, e.g., data related to establishing or maintaining a communication channel between UE 110 and a RAN device such as RAN device 180, etc., and communication data, e.g., data representing a telephone call, internet access, a database query, etc. In an aspect, provisioning data can comprise FEC selection information.

Ran device 180 can receive FEC selection information via FEC code selection component 120. In some embodiments, FEC code selection component 120 can be comprised in RAN device 180. In some embodiments, FEC code selection component 120 can be remote from RAN device 180, e.g., comprised in another device, a virtual component executing on, for example, a server, a gateway, a carrier core-network component, etc. In an aspect, FEC code selection component 120 can receive wireless system characteristic 102. FEC code selection component 120 can select a FEC code based on wireless system characteristic 102. As an example, wireless system characteristic 102 can be comprised in a FEC selection model including a service area associated with RAN device 180, such that FEC code selection component 120 can select FEC code based on a location of UE 110 in the service area. This can facilitate employing a selected FEC code in establishing or maintaining a communication channel between UE 110 and RAN device 180 to communicate data 190 in a manner that can perform better than conventional systems that can employ a fixed FEC code. As an example, where UE 110 determines a high signal to noise ratio for the communication channel link to RAN device 180, which ratio can be communicated to FEC code selection component 120 via wireless system characteristic 102, a turbo code FEC code can be selected to provide higher data rates than might be available using LDPC FEC coding. As a further example, where UE determines a low signal to noise ratio for the communication channel link to RAN device 180, a LDPC code can be indicated by FEC code selection component 120 allowing RAN device 180 to selected the LDPC coding to provide more robust performance than can be expected from turbo code FEC coding.

In an embodiment, FEC code selection component 120 can rank available FEC codes to facilitate RAN device 180 selecting a preferred FEC code. In an embodiment, FEC code selection component 120 can respond to changes in wireless system characteristic 102 and can adapt the ranking, indicate a different FEC code, etc. As an example, where UE 110 is employing turbo code FEC coding to communicate data 190 but enters a tunnel and thereby decreases available signal relative to noise, this change in the signal to noise characteristic can be employed by FEC code selection component 120 to indicate that the communication link should be adapted to employ polar FEC coding where polar FEC coding can perform better than turbo coding in low signal to noise conditions. In another example, where UE 110 is determined to be moving towards an interferer device, such as another eNodeB, an inference can be formed that a second FEC code can perform better than a first FEC code in the higher inference area associated with the interferer device, to which, FEC code selection component 120 can indicate RAN device 180 to switch to the second FEC code from the first FEC code. As a third example, where RAN device 180 is part of a self-organizing network (SON) and a second RAN device, not illustrated, is brought online in the SON, the coverage areas of RAN device 180 can be altered in response to the addition of the second RAN device. This change in coverage areas can be received by FEC code selection component 120 via wireless system characteristic 102, to facilitate determining if a second FEC code can perform better than a first FEC code in view of the changed coverage areas. Where the second code is determined to be likely to perform better under the new coverage areas, FEC code selection component 120 can communicate to RAN device 180 to alter the FEC coding of data 190 between UE 110 and RAN device 180, e.g., instruct UE 110 to employ the second FEC code and corresponding CQI table/data. Similarly, where the second RAN device goes offline, resulting coverage area changes in the SON can predicate FEC code selection component 120 determining that the first FEC code is likely to perform better than the second FEC code, whereby RAN device 180 can instruct UE 110 to employ the first FEC code and corresponding CQI table/data for further communication of data 190 between UE 110 and RAN device 180.

Figure 2:
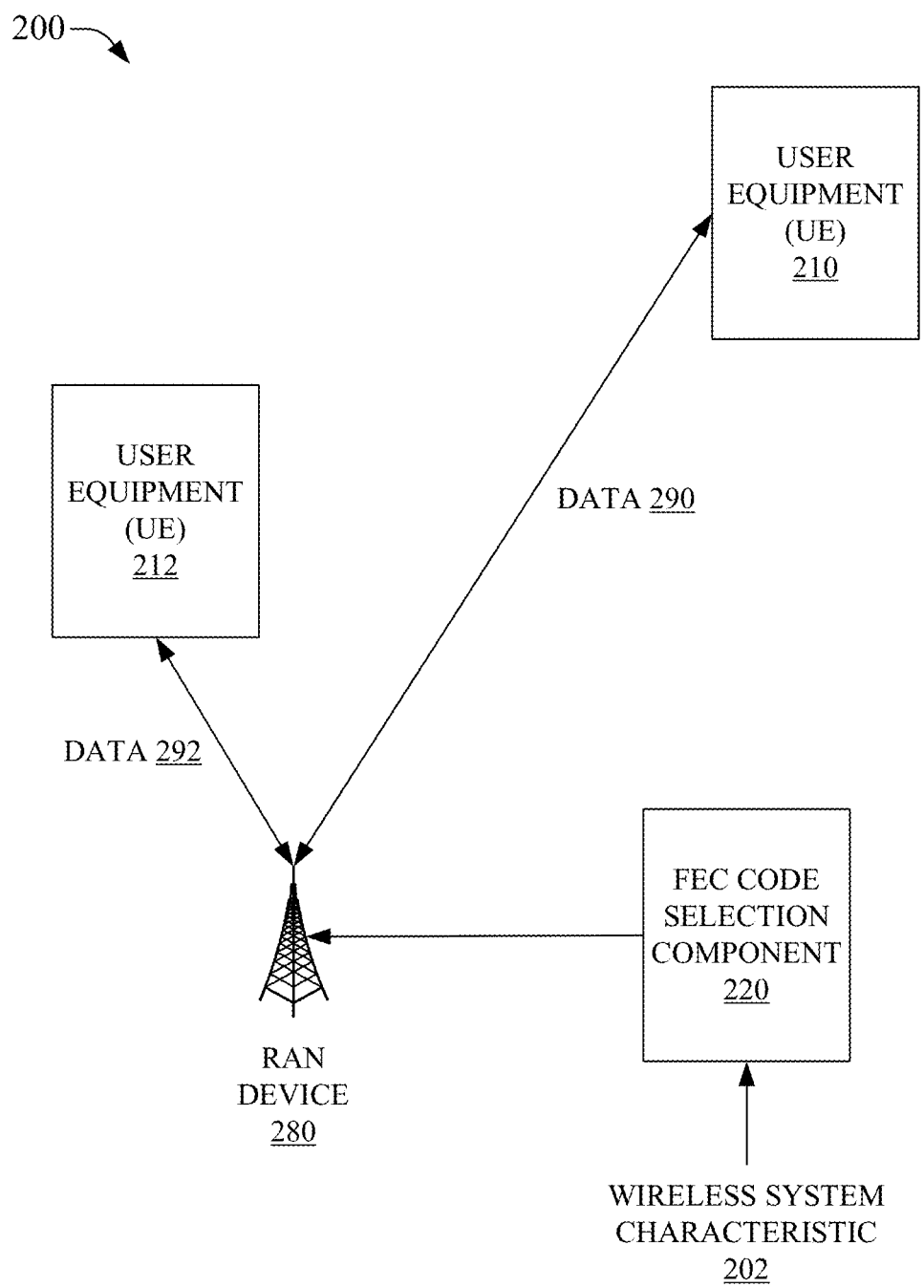
FIG. 2 is an illustration of an example system that can facilitate selection of separate forward error correction codes for a plurality of user equipments in a wireless system in accordance with aspects of the subject disclosure.

FIG. 2 is an illustration of a system 200, which can enable selection of separate forward error correction codes for a plurality of user equipments in a wireless system in accordance with aspects of the subject disclosure. System 200 can comprise UE 210 and UE 212. UE 210 and/or 212 can be a mobile device such as a cellular phone, smartphone, tablet computer, laptop computer, etc. UE 210 and 212 can be communicatively coupled to RAN device 280. UE 210 can send and/or receive data 290 via a wireless link to RAN device 290. UE 212 can send and/or receive data 292 via another wireless link to RAN device 290.

Ran device 280 can receive FEC selection information via FEC code selection component 220. In some embodiments, FEC code selection component 220 can be comprised in RAN device 280. In some embodiments, FEC code selection component 220 can be remote from RAN device 280. In an aspect, FEC code selection component 220 can receive wireless system characteristic 202. FEC code selection component 220 can select a FEC code based on wireless system characteristic 202. As an example, wireless system characteristic 202 can comprised UE location data, e.g., location data for UE 210 and 212. FEC code selection component 220 can select a FEC code for coding of data 290 based on a location of UE 210, and another FEC code for coding of data 292 based on a location of UE 212. This can facilitate employing a first selected FEC code in establishing or maintaining a first communication channel between UE 210 and RAN device 280 to communicate data 290 and a second selected FEC code in establishing or maintaining a second communication channel between UE 212 and RAN device 280 to communicate data 292. As an example, where UE 210 is at an edge of a wireless service area associated with RAN device 280, a LDPC FEC code can be selected to provide robust data at a lower data rate than might be available using turbo code. As a further example, where UE 212 is determined to be near RAN device 280 a turbo code FEC code can be indicated by FEC code selection component 220 allowing RAN device 280 to selected turbo coding to provide a higher data rate than can be expected from an LDPC FEC coding. In an aspect, FEC code selection component 220 can determine FEC code selection for one or more UEs served by RAN device 280, e.g., UE 210 and 212, based on wireless system characteristic 202. In another example, UE 210 can be at a cell edge while UE 212 can be near RAN device 280, however, where UE 212 is also in a noisy environment despite being near RAN device 280, FEC code selection component 220 can indicate that LDPC FEC coding be employed in coding both data 290 and data 292. Moreover, where UE 210 moves closer to RAN device 280 but does not enter a noisy area, FEC code selection component 220 can indicate that the FEC coding of data 290 be changed, for example, from LDPC to turbo code. Changes in the location of UEs, areas of high noise, interferers, topography, geography, etc., can all be received by FEC code selection component 220 via wireless system characteristic 202, enabling FEC code selection component 220 to be responsive to changes in the wireless system and to respond by adapting FEC coding of communication channels between UEs, e.g., UE 210 and 212, served by RAN device 280.

In an embodiment, FEC code selection component 220 can rank available FEC codes to facilitate RAN device 280 selecting a preferred FEC code for communication channels with UEs, e.g., UE 210, 212, etc. In an embodiment, FEC code selection component 220 can respond to changes in wireless system characteristic 202 and can adapt the ranking, indicate a different FEC code, etc. In an aspect, a UE, e.g., UE 210, 212, etc., can lack support for a FEC code ranked highly by FEC code selection component 220. In some embodiments, wireless system characteristic 202 can comprise UE data indicating supported FEC codes, such that FEC code selection component 220 can account for UE supported FEC codes in ranking or otherwise indicating a preferred FEC code. In some embodiments, FEC code selection component 220 can remain ignorant of UE supported FEC codes, e.g., where UE supported FEC code information is not comprised in wireless system characteristic 202. In these embodiments, the ranking or otherwise indicated preferred FEC code can include a FEC code not supported by a UE. As such, RAN device 280 can, in some embodiments, select a highest ranked FEC code that is also supported by the UE, or in some embodiments, can indicate to the UE the indicated FEC code and respond to an indication from the UE that the indicated FEC code is not supported by subsequently iteratively indicating a next lower ranked FEC code until a supported FEC code is arrived at.

Figure 3:
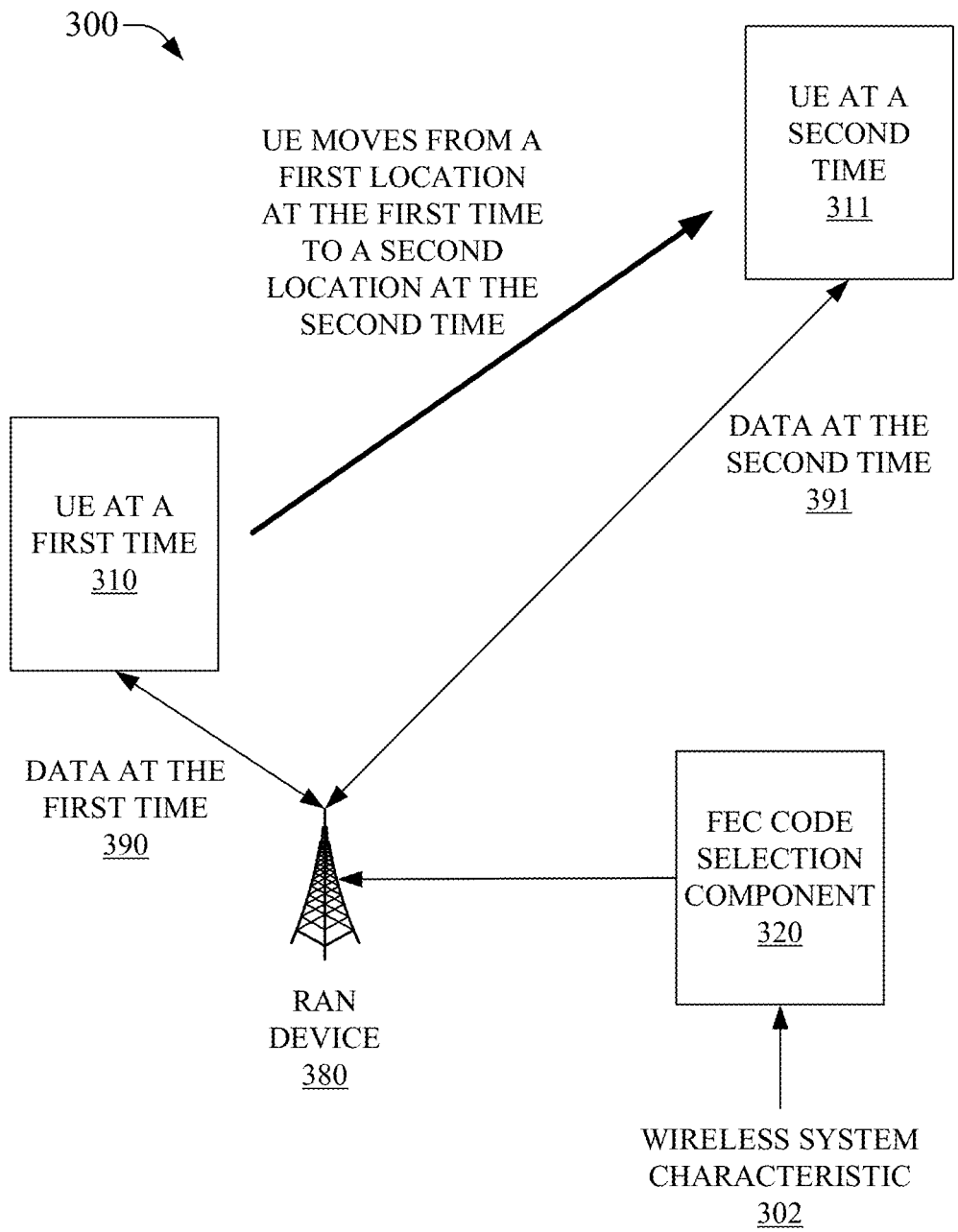
FIG. 3 is an illustration of an example system that can facilitate dynamic reselection of forward error correction codes for a user equipment in a wireless system in accordance with aspects of the subject disclosure.

FIG. 3 is an illustration of a system 300, which can facilitate dynamic reselection of forward error correction codes for a UE in a wireless system in accordance with aspects of the subject disclosure. System 300 can comprise a UE at a first time, hereinafter UE 310, that can be moved to another location indicated as UE at a second time, hereinafter UE 311. UE 310 can be communicatively coupled to radio access network (RAN) device 380. UE 310 can send and/or receive data at the first time, hereinafter data 390, via a wireless link to RAN device 380. Data 390, can comprise provisioning data, e.g., data related to establishing or maintaining a communication channel between UE 310 and a RAN device such as RAN device 380, etc., and communication data, e.g., data representing a telephone call, internet access, a database query, etc. In an aspect, provisioning data can comprise FEC selection information. It can be observed that where UE 310 moves in time to UE 311, data 390 can become data at the second time, hereinafter data 391.

Ran device 380 can receive FEC selection information via FEC code selection component 320. In some embodiments, FEC code selection component 320 can be local to RAN device 380 or remote from RAN device 380. In an aspect, FEC code selection component 320 can receive wireless system characteristic 302. FEC code selection component 320 can select a FEC code based on wireless system characteristic 302. As an example, wireless system characteristic 302 can be coverage area topography for a coverage area associated with RAN device 380. FEC code selection component 320 can select a FEC code based on topography for a location of UE 310 in the service area. This can facilitate employing a selected FEC code in establishing or maintaining a communication channel between UE 310 and RAN device 380 to communicate data 390 in a manner that can perform better than conventional systems. Where UE 310 evolves into UE 311, e.g., moves from the first location at the first time to the second location at the second time, data 390 can evolve into data 391. Data 391 can experience different characteristics of the wireless system than data 390, e.g., different distance from RAN device 380, different topography at the second location, etc. This characteristic information about the wireless system can be communicated via wireless system characteristic 302 to FEC code selection component 320. FEC code selection component 320 can respond to the changes in wireless system characteristic 302 by updating the FEC coding employed by data 391 in comparison to data 390.

In some embodiments, FEC code selection component 320 can rank available FEC codes to facilitate RAN device 380 selecting a preferred FEC code. In some embodiments, FEC code selection component 320 can respond to changes in wireless system characteristic 302 and can adapt the ranking, indicate a different FEC code, etc. As an example, UE 310 can employing turbo code FEC coding to communicate data 390 based on the topography of the service area of RAN device 380 at the first location. Moving UE 310 can result in a different topography of the service area at the second location, e.g., UE 310 becomes UE 311. This change in the topographical characteristic of the wireless system can be employed by FEC code selection component 320 to indicate that the communication link should be adapted to employ LDPC FEC coding where LDPC FEC coding is determined to perform better than turbo coding in the topography of the second location, e.g., data 391 can employ LDPC as adapted from data 390 employing turbo code.

Figure 4:
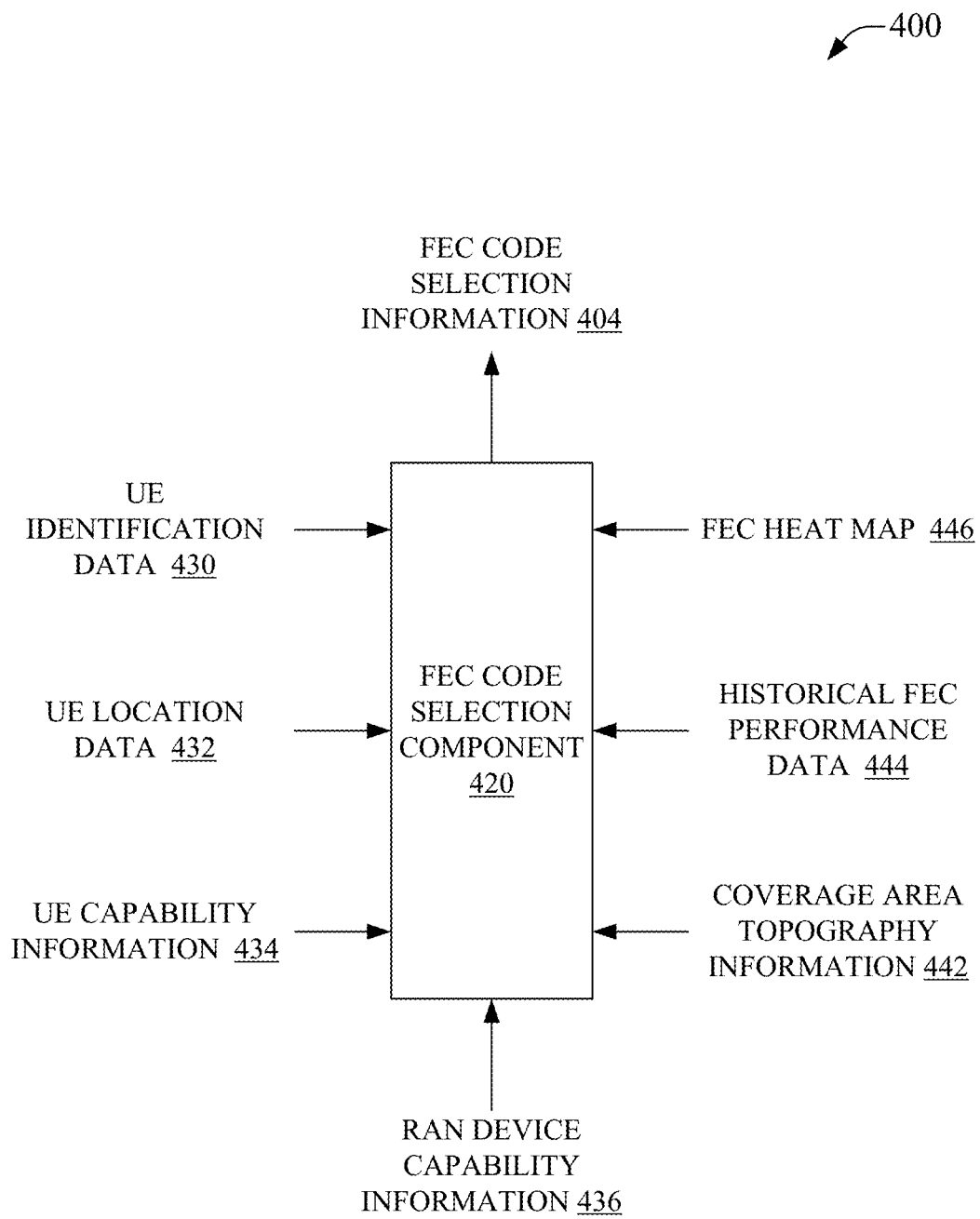
FIG. 4 is an illustration of an example system that can enable forward error correction code selection based on one or more characteristics or parameters of a communication event in a wireless system in accordance with aspects of the subject disclosure.

FIG. 4 is an illustration of a system 400, which can facilitate forward error correction code selection based on one or more characteristics or parameters of a communication event in a wireless system in accordance with aspects of the subject disclosure. System 400 can comprise FEC code selection component 420. In some embodiments, FEC code selection component can be the same as, or similar to FEC code selection component(s) 120, 220, 320, etc. FEC code selection component 420 can enable access to FEC code selection information 404. FEC code selection information 404 can be employed by a RAN device, e.g., 180, 280, 380, etc., to employ a selected FEC code in a establishing or maintaining a communication channel with a UE, e.g., UE 110, 210, 212, 310, 311, etc. In an embodiment, FEC code selection information 404 can comprise a preferred FEC code identifier that identifies a FEC code that is preferred based on characteristic(s) of a wireless system, e.g., location, distance, proximity, geography, geometry, topology, UE capability, FEC selection model(s), etc. In another embodiment, FEC code selection information 404 can comprise a ranked plurality of FEC code indicators, e.g., indicating a most preferred and subsequently preferred FEC codes, which can enable a RAN device to select a FEC code that is supported based on the order of the ranked FEC codes. As an example, where a most preferred FEC code is not supported by a UE, a next preferred code can be employed.

FEC code selection component 420 can receive wireless system characteristic(s). Wireless system characteristic(s) can comprise, but are expressly not limited to, UE identification data 430, UE location data 432, UE capability information 434, RAN device capability information 436, coverage area topography information 442, historical FEC performance data 444, FEC heat map 446, etc. In an aspect, UE identification data 430 can identify a UE served by a RAN device. UE identification can enable FEC code selection component 420 to associated information, e.g., FEC code in use, historical FEC use/performance, etc., for a particular identified UE. UE location data 432 can indicate a location of a UE in a service area of a RAN device. In an aspect, UE location data 432 can comprise location, proximity, distance, geometry, etc., of the UE in the service area. As such, UE location data 432 can facilitate FEC code selection component 420 in determining FEC code selection based on location, distance, proximity, geometry, etc.

UE capability information 434 and RAN device capability information 436 can correspondingly comprise information relating the capability of a UE and a RAN device. A capability of a UE or RAN device can relate to support of specific FEC code schema. As an example, UE capability information 434 can indicate that only LDPC is supported by a UE, while RAN device capability information 436 can indicate that the RAN device supports LDPC, polar, and turbo code. Based on UE capability information 434 and RAN device capability information 436, FEC code selection component 420 can indicate that LDPC be selected because only LDPC is supported by both the UE and the RAN device.

Coverage area topography information 442 can comprise information about topographical features of at least a portion of a wireless service area associated with a RAN device. In some embodiments, the topographical features can be correlated with a performance of a FEC code. As such, coverage area topography information 442 can be employed by FEC code selection component 420 to determine a preferred FEC code or ranking of FEC codes based on topography and corresponding performance of FEC codes. In an aspect, coverage area topography information 442 be employed to generate, or can itself comprise, a model of FEC code(s) topographical performance, which can enable FEC code selection component 420 to indicate a preferred FEC code based on topography information of the service area between a UE and a service RAN device.

Historical FEC performance data 444 can comprise FEC performance information for past communication channels. Where difference FEC codes are employed over time in particular portions of a wireless service area for a RAN device, this historical performance information can be employed in ranking FEC codes. As an example, where performance of a first FEC code has continued to decrease for a particular area associated with construction of new office buildings, further construction can be anticipated to continue to decrease the performance of the first FEC code in that area and, accordingly, the ranking of the first FEC code can be decreased relative to other FEC codes that have not similarly indicated a similar level of performance degradation. In some embodiments, historical FEC performance data 444 can enable adapting rankings of FEC codes for areas associated with the historical performance data. In some embodiments, historical FEC performance data 444 can facilitate correlating performance changes with identifiable features associated with the historical performance data to allow extrapolation to other coverage areas having the same, or similar, identifiable features. As an example, where snowy weather negatively affects FEC coding performance in New York, this information can be employed to adjust FET coding rankings in Fargo where snow is imminent. In an aspect, historical FEC performance data 444 can be incorporated into a FEC selection model(s).

FEC heat map 446 can comprise heat map-type information indicating preferred FEC codes for a portion of a service area associated with a RAN device. This can facilitate selection of a preferred FEC code for a UE in a given location within the portion of the service area. Moreover, in some embodiments, a predicted UE track through the service area can enable adapting the preferred FEC coding as the UE moves along the track. As an example, where a FEC heat map 446 encompasses a coverage area service the Sunrise Highway, a UE moving along the Sunrise Highway can be expected to continue on the Sunrise Highway because there are few other roads in the area. As such, FEC code selection component 420 can anticipatorily determine adaptations to FEC coding based on heat map-type data along the Sunrise Highway.

In some embodiments, FEC code selection component 420 can employ some, none, or all, of the disclosed wireless system characteristics, including, UE identification data 430, UE location data 432, UE capability information 434, RAN device capability information 436, coverage area topography information 442, historical FEC performance data 444, FEC heat map 446, in any combination. Moreover, in some embodiments other wireless system characteristics not enumerated herein for the sake of clarity and brevity can similarly be employed in determining a preferred FEC code or ranking of FEC codes.

In view of the example system(s) described above, example method(s) that can be implemented in accordance with the disclosed subject matter can be better appreciated with reference to flowcharts in FIG. 5-FIG. 8. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

Figure 5:
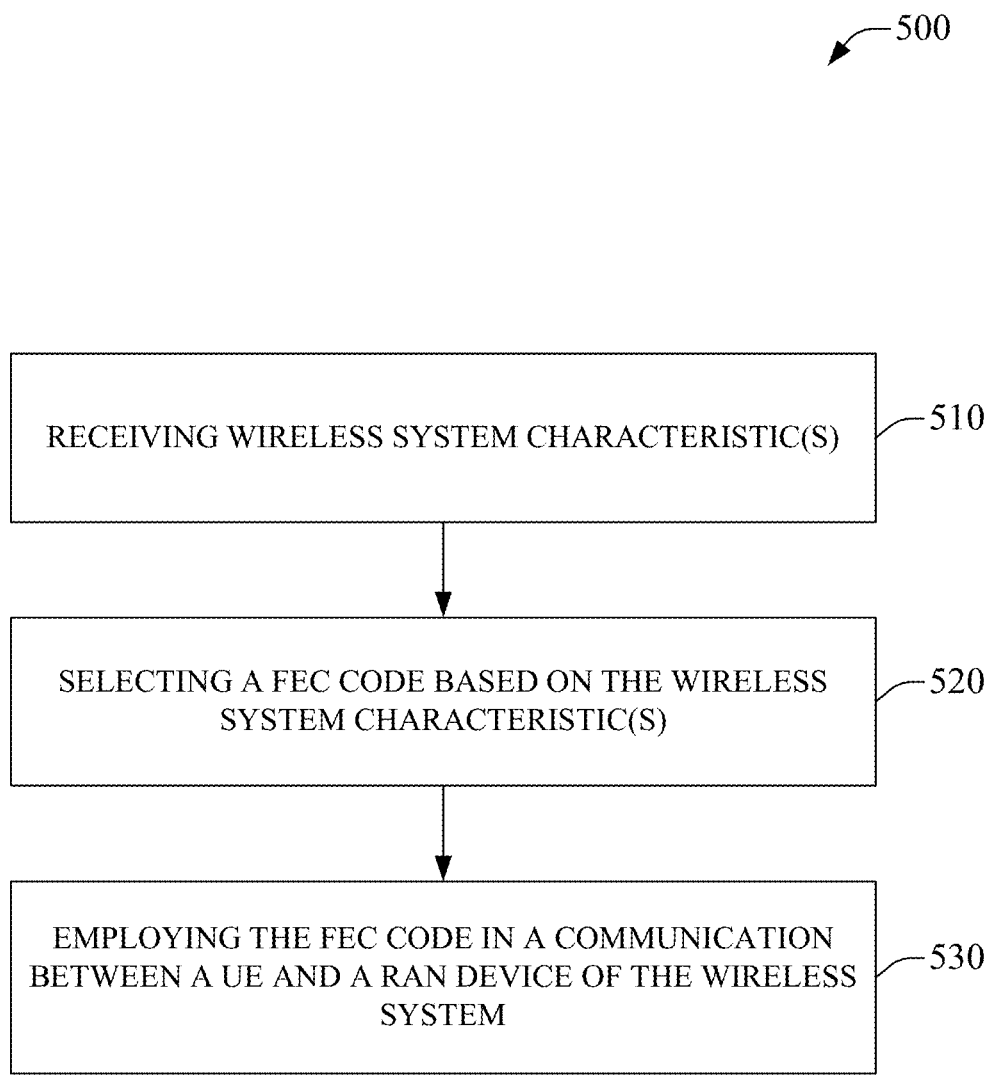
FIG. 5 illustrates an example method facilitating forward error correction code selection in a wireless system in accordance with aspects of the subject disclosure.

FIG. 5 illustrates a method 500 that facilitates forward error correction code selection in a wireless system in accordance with aspects of the subject disclosure. Method 500, at 510, can comprise receiving wireless system characteristic(s). A wireless system characteristic can comprise information related to a wireless network or communication channel. A wireless system characteristic can indicate which FEC codes will work most effectively for a given value of that characteristic. As examples, a wireless system characteristic can be a distance between a UE device and a RAN device, noise or interference on a communication channel, geography or topography in a wireless network service area, etc. In an aspect, a wireless system characteristic can affect the performance of a FEC coding scheme applied to a communication channel by a wireless system operator via a RAN device.

At 520, method 500 can comprise, selecting a FEC code based on the wireless system characteristic(s) received at 510. A selected FEC code can be employed in establishing or maintaining a communication channel between a UE and a RAN device to communicate data via the communication channel in a manner that can perform better than conventional systems that can employ a fixed FEC code. In an embodiment, the selected FEC code can be chosen from a rank ordered group of FEC codes. The rank ordering of the FEC codes can reflect the expected or determined performance of each FEC code under the given wireless system characteristic(s) received at 510.

Method 500, at 530, can comprise employing the FEC code, selected at 520, in a communication between a UE and a RAN device of the wireless system. At this point, method 500 can end. As an example, where a UE indicates a high signal to noise ratio for a communication channel, e.g., a wireless system characteristic, a turbo code FEC code can be selected, at 520, to provide, at 530, higher data rates than might be available using LDPC FEC coding. As a further example, where a UE determines a low signal to noise ratio for the communication channel, a LDPC code can be selected, at 520, and employed, at 530, to provide more robust performance than can be expected from turbo code FEC coding.

In an embodiment, the wireless system characteristic(s) received at 510 can relate to one or more UEs associated with a RAN device serving a portion of the wireless system. Moreover, selection at 520 can comprise selecting a FEC code for the one or more UEs. This can facilitate different UEs employing, at 530, different FEC codes based on the particular values of the wireless system characteristic(s) affecting the individual UEs. Further, in some embodiments, subsequent changes to a wireless system characteristic(s) can be associated with corresponding adaptation of the selected FEC code employed in the communication channel at 530, e.g., as the wireless system characteristic(s) evolve, the employed FEC codes for each of the one or more UEs can correspondingly be adapted, resulting in an improvement of the performance of the wireless system itself, e.g., dynamic adaptation of employed FEC codes.

Figure 6:
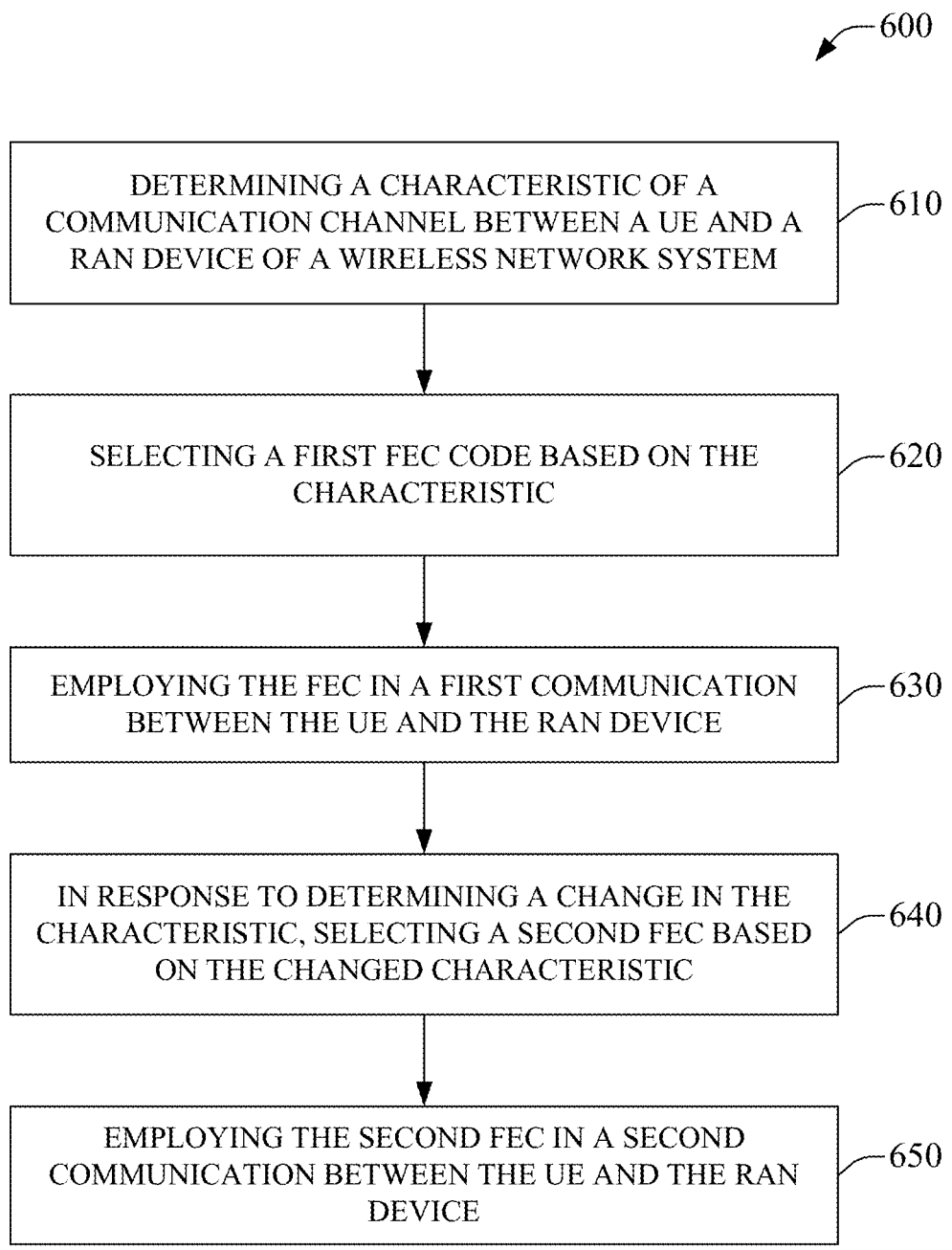
FIG. 6 illustrates an example method facilitating responsive reselection of forward error correction codes for a user equipment in accordance with aspects of the subject disclosure.

FIG. 6 illustrates a method 600, which facilitates responsive reselection of forward error correction codes for a user equipment, in accordance with aspects of the subject disclosure. Method 600 can comprise, at 610, determining a characteristic of a communication channel between a UE and a RAN device of a wireless network. A characteristic of the communication channel can indicate which FEC codes will work most effectively in view of conditions experiences by the communication channel and the parameters thereof. As examples, a communication channel characteristic can be a signal to noise ratio that can indicate a level of robustness in FEC coding to decrease loss of data while maintaining a sufficiently high data throughput and consuming sufficiently low carrier resources. Where the example signal to noise ratio is high, a faster but less robust FEC coding can be selected while, in contrast, where the signal to noise ratio is low, a more robust FEC coding can be selected even where it is somewhat slower than other less robust FEC coding. At 620, method 600 can comprise, selecting a first FEC code based on the characteristic determined at 610. At 630, the selected FEC code can be employed in a first communication between the UE and the RAN device via the communication channel.

At 640, method 600 can comprise, determining a change in the characteristic. As an example, a signal to noise ratio can change where an interferer device moves closer to the UE or RAN device, which can degrade the communication channel sufficiently to cause increasing data loss under a then employed FEC code. Method 600, at 640, can further comprise, in response to determining the change, selecting a second FEC code based on the changed characteristic. Continuing the present example, a more robust FEC code that can perform better in a lower signal to noise ratio environment can be selected. In another example, where the signal to noise level improves, e.g., an interferer moves away from the UE or RAN device, the change can cause a selection response to a faster FEC code that can be less robust because the robustness of the faster FEC code is sufficient in the higher signal to noise environment.

At 650, method 600 can comprise, employing the second FEC in a second communication between the UE and the RAN device via the communication channel. At this point method 600 can end. Method 600 illustrates adapting a communication channel by employing different FEC coding schemes in response to changes to the characteristics of the communication channel between a UE and a service RAN device, an aspect not employed in conventional wireless network systems.

Figure 7:
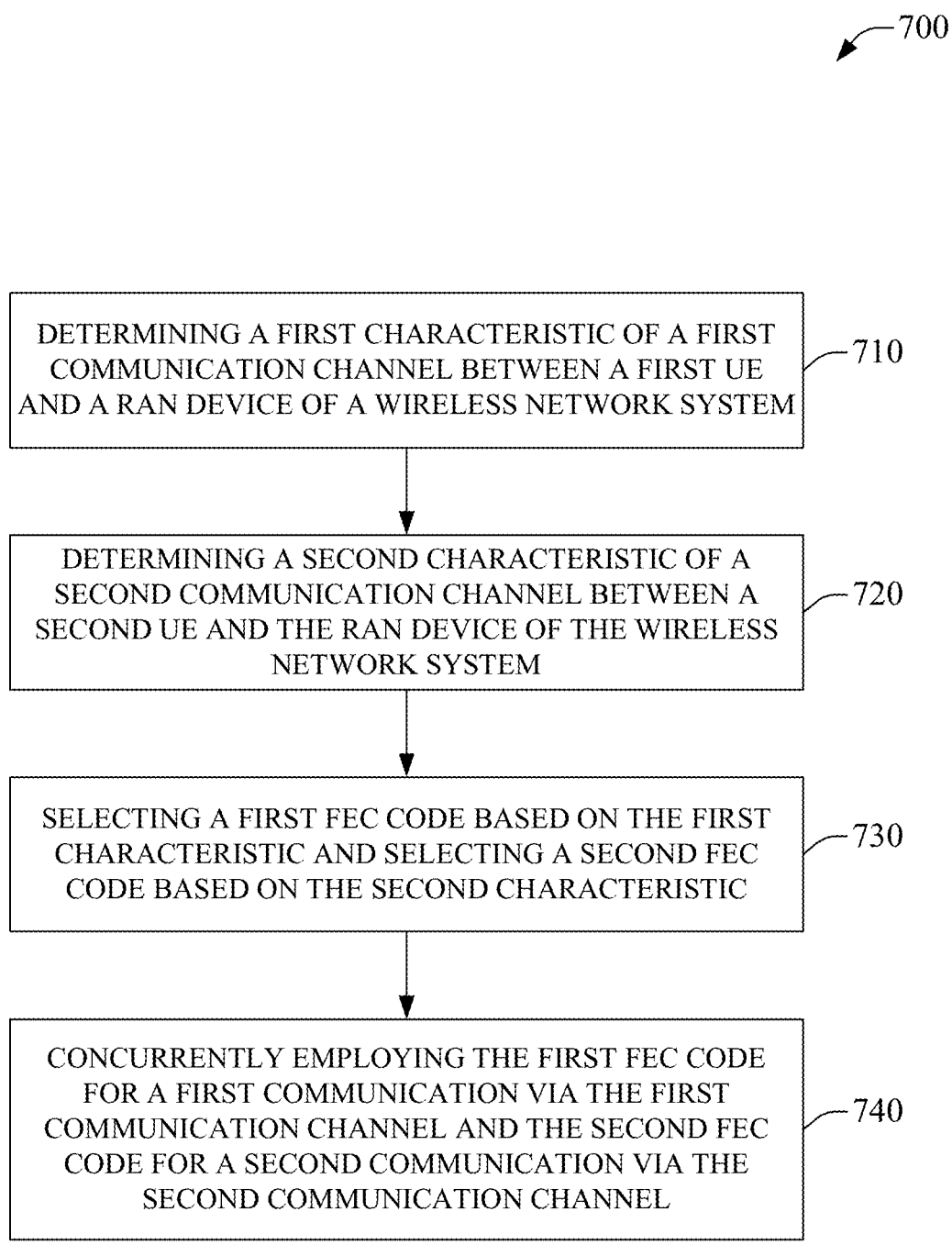
FIG. 7 illustrates an example method facilitating selection of distinct forward error correction codes for concurrent use by a plurality of user equipments in a wireless system in accordance with aspects of the subject disclosure.

FIG. 7 illustrates a method 700, which enables selection of distinct forward error correction codes for concurrent use by a plurality of user equipments in a wireless system in accordance with aspects of the subject disclosure. Method 700 can comprise, at 710, determining a first characteristic of a first communication channel between a first UE and a RAN device of a wireless network system. The first characteristic of the first communication channel can indicate which FEC codes will work most effectively in view of conditions experienced by, and the parameters of, the first communication channel.

At 720, method 700 can comprise, determining a second characteristic of a second communication channel between a second UE and the RAN device of the wireless network system. The second characteristic of the second communication channel can indicate which FEC codes will work most effectively in view of conditions experienced by, and the parameters of, the second communication channel.

Method 700, at 730, can comprise selecting a first FEC code based on the first characteristic determined at 710 and selecting a second FEC code based on the second characteristic determined at 720. In an aspect, the first FEC code and the second FEC code can be the same FEC code or can be different FEC codes. In an embodiment, where the first and second FEC codes are the same FEC code, this can be a result of the first UE and second UE being in the same or similar environments, e.g., where the first and second UE are, for example, in the same hotel room, it can be expected that they will share nearly identical wireless system characteristics and it is not surprising that they can have the same FEC code selected for each device. In some embodiments, where the first and second FEC codes are again the same FEC code, this can be a result of the first UE and second UE being in similar environments but not proximate to each other, for example, where the first UE is at a first edge of a cell, and the second UE is at a second edge of the same cell, perhaps several miles apart, the two separate wireless environments can still have highly similar wireless system characteristics which can result in the same FEC code being selected for each device. Additionally, in some embodiments, where the first and second FEC codes are again the same FEC code, this can be a result of the first UE and second UE being in dissimilar environments that each result in selection of the same FEC code, for example the first UE can be in a high signal to noise environment but be distant from the RAN device, and the second UE can be in a low signal to noise environment but be located close to the RAN device, which can result in selecting the same FEC code but doing so based on different characteristics. In some embodiments, limited FEC code support between the RAN device and the first and second UEs can also result in selection of the same FEC code despite substantially different characteristics.

At 740, method 700 can comprise, concurrently employing the first FC code for a first communication via the first communication channel and the second FEC code for a second communication via the second communication channel. At this point method 700 can end.

Figure 8:
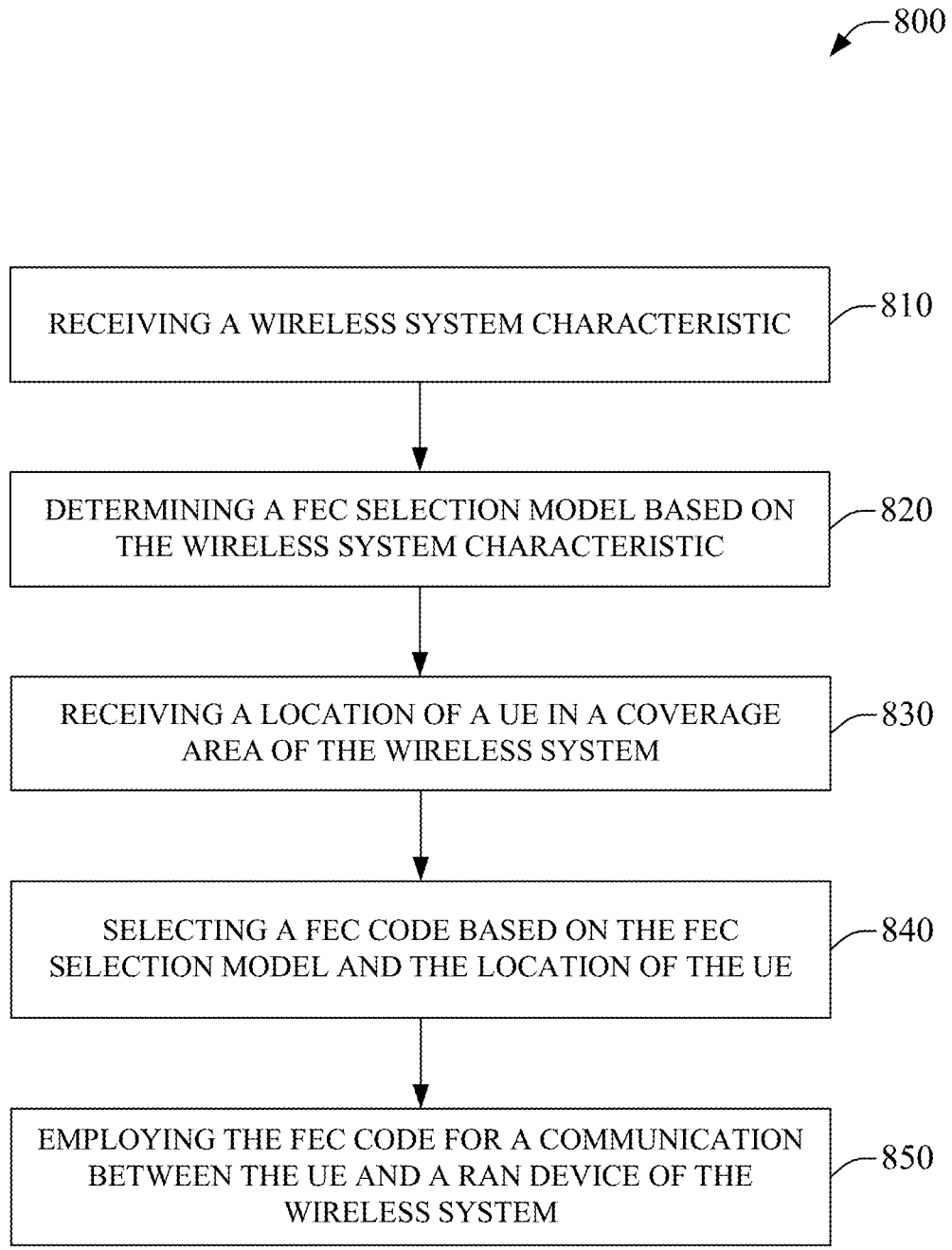
FIG. 8 illustrates an example method enabling use of a forward error correction code selection model, based on a wireless system characteristic, for selection of a forward error correction code in accordance with aspects of the subject disclosure.

FIG. 8 illustrates a method 800 that facilitates use of a forward error correction code selection model, based on a wireless system characteristic, for selection of a forward error correction code in accordance with aspects of the subject disclosure. Method 800, at 810, can comprise receiving a wireless system characteristic. The wireless system characteristic can be employed to determine which FEC codes will work most effectively for communication based on the state of the wireless system.

At 820, method 800 can comprise, determining a FEC code selection model based on the characteristic. FEC code selection modeling can comprise individual characteristics and/or combinations of various characteristics, e.g., an example FEC selection model can be based on location, proximity, and geometry, can be based on location only, proximity only, geometry only, can be based on a selected characteristic to allow selection of location, proximity, geometry, etc. It will be noted that the subject disclosure is not limited to the aforementioned characteristics and that other characteristics are not presently disclosed only for the sake of clarity and brevity.

At 830, a location of a UE in a coverage area of the wireless system can be received. At 840, method 800 can comprise, selecting a FEC code based on the location of the UE in the wireless system, e.g., in the coverage area served by a RAN device, and on the FEC code selection model. In an aspect, the model can indicate a preferred FEC code, or rank ordered group of FEC codes, for portions of a service area served by a RAN device such that, given a location of a UE, the model can be employed to select a FEC code that can perform well in the area associated with the location. Moreover, in some embodiments, historical FEC code performance can be employed in the FEC code selection model. At 850, method 800 can comprise, employing the second FEC in a second communication between the UE and the RAN device via the communication channel. At this point method 800 can end.

Figure 9:
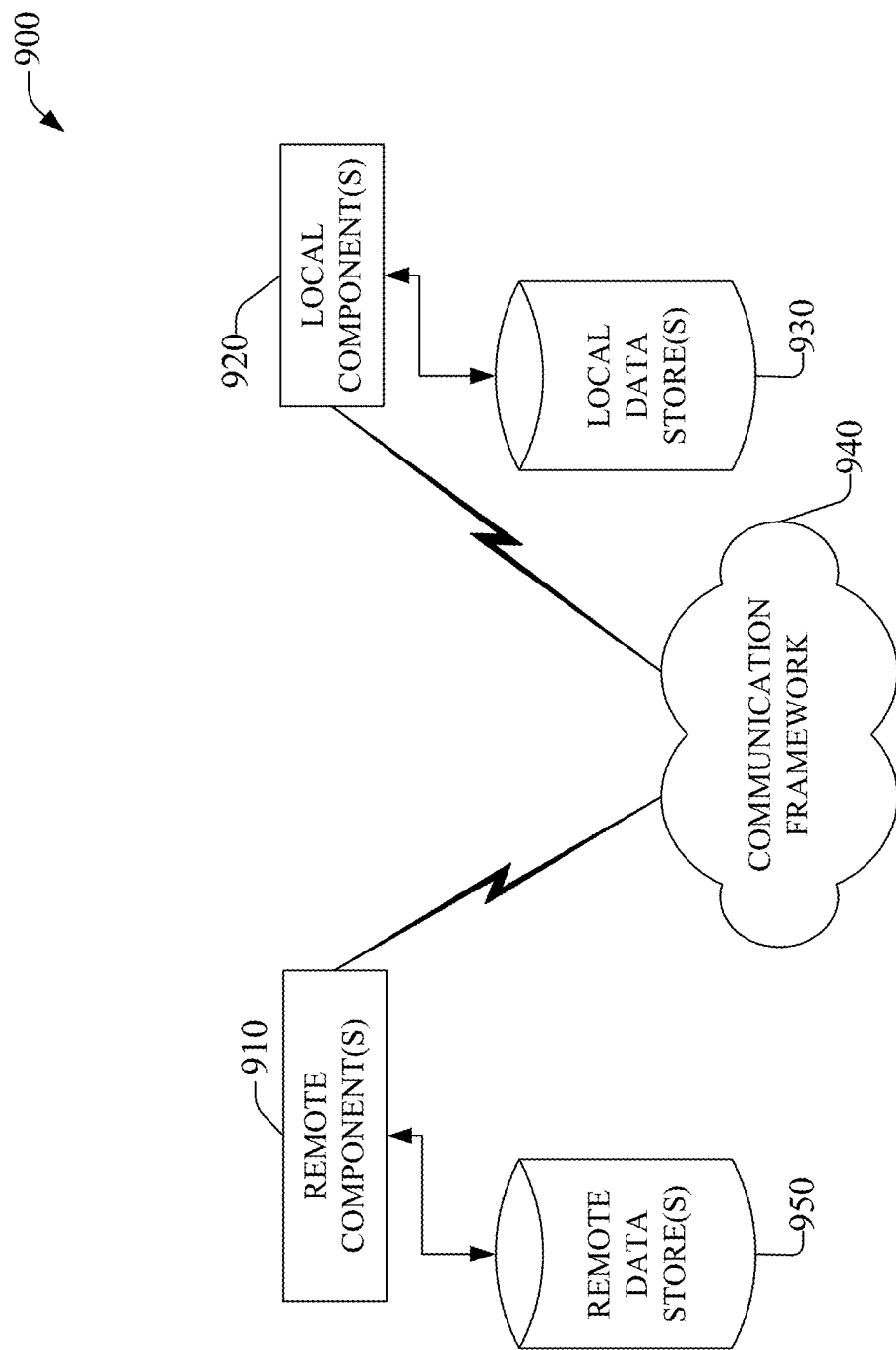
FIG. 9 depicts an example schematic block diagram of a computing environment with which the disclosed subject matter can interact.

FIG. 9 is a schematic block diagram of a computing environment 900 with which the disclosed subject matter can interact. The system 900 comprises one or more remote component(s) 910. The remote component(s) 910 can be hardware and/or software (e.g., threads, processes, computing devices). In some embodiments, remote component(s) 910 can comprise servers, personal servers, wireless telecommunication network devices, RAN device(s), etc. As an example, remote component(s) 910 can be FEC code selection component 120, 220, 320, 420, etc., UE 110, 210, 212, 310, 311, etc.

The system 900 also comprises one or more local component(s) 920. The local component(s) 920 can be hardware and/or software (e.g., threads, processes, computing devices). In some embodiments, local component(s) 920 can comprise, for example, RAN device 180, 280, 380, etc., FEC code selection component 120, 220, 320, 420, etc.

One possible communication between a remote component(s) 910 and a local component(s) 920 can be in the form of a data packet adapted to be transmitted between two or more computer processes. Another possible communication between a remote component(s) 910 and a local component(s) 920 can be in the form of circuit-switched data adapted to be transmitted between two or more computer processes in radio time slots. The system 900 comprises a communication framework 940 that can be employed to facilitate communications between the remote component(s) 910 and the local component(s) 920, and can comprise an air interface, e.g., Uu interface of a UMTS network, via a long-term evolution (LTE) network, etc. Remote component(s) 910 can be operably connected to one or more remote data store(s) 950, such as a hard drive, solid state drive, SIM card, device memory, etc., that can be employed to store information on the remote component(s) 910 side of communication framework 940. Similarly, local component(s) 920 can be operably connected to one or more local data store(s) 930, that can be employed to store information on the local component(s) 920 side of communication framework 940. As examples, wireless system characteristic 102, 202, 302, etc., UE identification data 430, UE location data 432, UE capability information 434, RAN device capability information 436, coverage area topography information 442, historical FEC performance data 444, FEC heat map 446, etc., CQI table/data, etc., can be stored on a data store(s) 950 of a remote component 910. Similarly, FEC code selection information, CQI table/data, etc., can be stored on a local data store(s) 930 of a local component 920.

Figure 10:
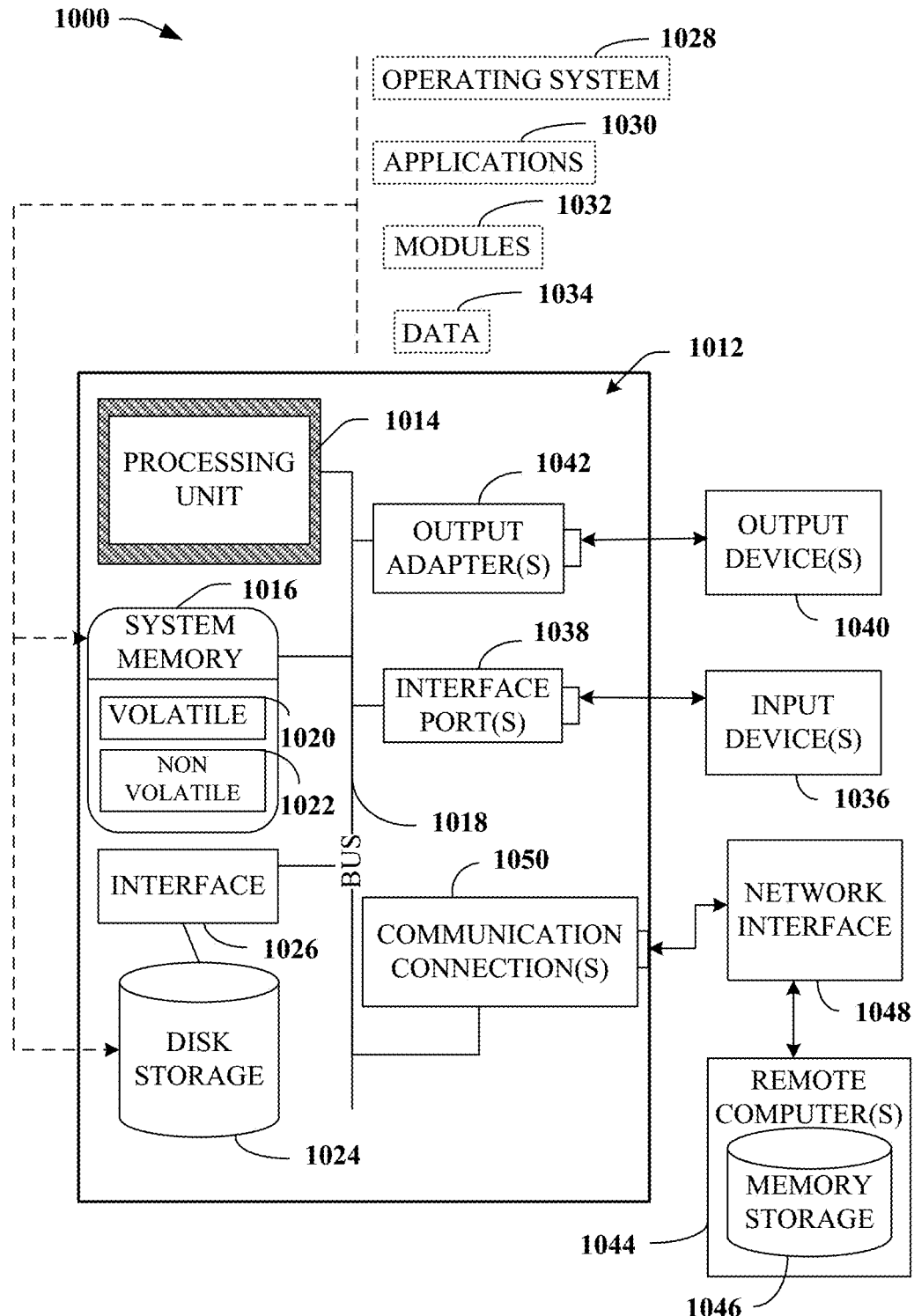
FIG. 10 illustrates an example block diagram of a computing system operable to execute the disclosed systems and methods in accordance with an embodiment.

In order to provide a context for the various aspects of the disclosed subject matter, FIG. 10, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that performs particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can comprise both volatile and nonvolatile memory, by way of illustration, and not limitation, volatile memory 1020 (see below), nonvolatile memory 1022 (see below), disk storage 1024 (see below), and memory storage 1046 (see below). Further, nonvolatile memory can be included in read only memory, programmable read only memory, electrically programmable read only memory, electrically erasable read only memory, or flash memory. Volatile memory can comprise random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, comprising single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 10 illustrates a block diagram of a computing system 1000 operable to execute the disclosed systems and methods in accordance with an embodiment. Computer 1012, which can be, for example, RAN device 180, 280, 380, etc., UE 110, 210, 212, 310, 311, etc., FEC code selection component 120, 220, 320, 420, etc., comprises a processing unit 914, a system memory 1016, and a system bus 1018. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture, microchannel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1194), and small computer systems interface.

System memory 1016 can comprise volatile memory 1020 and nonvolatile memory 1022. A basic input/output system, containing routines to transfer information between elements within computer 1012, such as during start-up, can be stored in nonvolatile memory 1022. By way of illustration, and not limitation, nonvolatile memory 1022 can comprise read only memory, programmable read only memory, electrically programmable read only memory, electrically erasable read only memory, or flash memory. Volatile memory 1020 comprises read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, Synchlink dynamic read only memory, Rambus direct read only memory, direct Rambus dynamic read only memory, and Rambus dynamic read only memory.

Computer 1012 can also comprise removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, flash memory card, or memory stick. In addition, disk storage 1024 can comprise storage media separately or in combination with other storage media comprising, but not limited to, an optical disk drive such as a compact disk read only memory device, compact disk recordable drive, compact disk rewritable drive or a digital versatile disk read only memory. To facilitate connection of the disk storage devices 1024 to system bus 1018, a removable or non-removable interface is typically used, such as interface 1026.

Computing devices typically comprise a variety of media, which can comprise computer-readable storage media or communications media, which two terms are used herein differently from one another as follows.

Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can comprise non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium. As such, for example, a computer-readable medium can comprise executable instructions stored thereon that, in response to execution, cause a system comprising a processor to perform operations, comprising selecting a FEC code based on a wireless system characteristic.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

It can be noted that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be noted that the disclosed subject matter can be implemented with various operating systems or combinations of operating systems.

A user can enter commands or information into computer 1012 through input device(s) 1036. In some embodiments, a user interface can allow entry of user preference information, etc., and can be embodied in a touch sensitive display panel, a mouse/pointer input to a graphical user interface (GUI), a command line controlled interface, etc., allowing a user to interact with computer 1012. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1014 through system bus 1018 by way of interface port(s) 1038. Interface port(s) 1038 comprise, for example, a serial port, a parallel port, a game port, a universal serial bus, an infrared port, a Bluetooth port, an IP port, or a logical port associated with a wireless service, etc. Output device(s) 1040 use some of the same type of ports as input device(s) 1036.

Thus, for example, a universal serial busport can be used to provide input to computer 1012 and to output information from computer 1012 to an output device 1040. Output adapter 1042 is provided to illustrate that there are some output devices 1040 like monitors, speakers, and printers, among other output devices 1040, which use special adapters. Output adapters 1042 comprise, by way of illustration and not limitation, video and sound cards that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, cloud storage, a cloud service, code executing in a cloud-computing environment, a workstation, a microprocessor based appliance, a peer device, or other common network node and the like, and typically comprises many or all of the elements described relative to computer 1012. A cloud computing environment, the cloud, or other similar terms can refer to computing that can share processing resources and data to one or more computer and/or other device(s) on an as needed basis to enable access to a shared pool of configurable computing resources that can be provisioned and released readily. Cloud computing and storage solutions can storing and/or processing data in third-party data centers which can leverage an economy of scale and can view accessing computing resources via a cloud service in a manner similar to a subscribing to an electric utility to access electrical energy, a telephone utility to access telephonic services, etc.

For purposes of brevity, only a memory storage device 1046 is illustrated with remote computer(s) 1044. Remote computer(s) 1044 is logically connected to computer 1012 through a network interface 1048 and then physically connected by way of communication connection 1050. Network interface 1048 encompasses wire and/or wireless communication networks such as local area networks and wide area networks. Local area network technologies comprise fiber distributed data interface, copper distributed data interface, Ethernet, Token Ring and the like. Wide area network technologies comprise, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and digital subscriber line modems, integrated services digital network adapters, and Ethernet cards.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Moreover, terms like "user equipment (UE)," "mobile station," "mobile," subscriber station," "subscriber equipment," "access terminal," "terminal," "handset," and similar terminology, refer to a wireless device utilized by a subscriber or user of a wireless communication service to receive or convey data, control, voice, video, sound, gaming, or substantially any data-stream or signaling-stream. The foregoing terms are utilized interchangeably in the subject specification and related drawings. Likewise, the terms "access point," "base station," "Node B," "evolved Node B," "eNodeB," "home Node B," "home access point," and the like, are utilized interchangeably in the subject application, and refer to a wireless network component or appliance that serves and receives data, control, voice, video, sound, gaming, or substantially any data-stream or signaling-stream to and from a set of subscriber stations or provider enabled devices. Data and signaling streams can comprise packetized or frame-based flows. Data or signal information exchange can comprise technology, such as, multiple-input and multiple-output (MIMO) radio(s), long-term evolution (LTE), LTE time-division duplexing (TDD), global system for mobile communications (GSM), GSM EDGE Radio Access Network (GERAN), WI FI, WLAN, WIMAX, CDMA2000, LTE new radio-access technology (LTE-NX), massive MIMO systems, etc.

Additionally, the terms "core-network", "core", "core carrier network", "carrier-side", or similar terms can refer to components of a telecommunications network that typically provides some or all of aggregation, authentication, call control and switching, charging, service invocation, or gateways. Aggregation can refer to the highest level of aggregation in a service provider network wherein the next level in the hierarchy under the core nodes is the distribution networks and then the edge networks. UEs do not normally connect directly to the core networks of a large service provider but can be routed to the core by way of a switch or radio access network. Authentication can refer to determinations regarding whether the user requesting a service from the telecom network is authorized to do so within this network or not. Call control and switching can refer determinations related to the future course of a call stream across carrier equipment based on the call signal processing. Charging can be related to the collation and processing of charging data generated by various network nodes. Two common types of charging mechanisms found in present day networks can be prepaid charging and postpaid charging. Service invocation can occur based on some explicit action (e.g. call transfer) or implicitly (e.g., call waiting). It is to be noted that service "execution" may or may not be a core network functionality as third party network/nodes may take part in actual service execution. A gateway can be present in the core network to access other networks. Gateway functionality can be dependent on the type of the interface with another network.

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities or automated components (e.g., supported through artificial intelligence, as through a capacity to make inferences based on complex mathematical formalisms), that can provide simulated vision, sound recognition and so forth.

Aspects, features, or advantages of the subject matter can be exploited in substantially any, or any, wired, broadcast, wireless telecommunication, radio technology or network, or combinations thereof. Non-limiting examples of such technologies or networks comprise broadcast technologies (e.g., sub-Hertz, extremely low frequency, very low frequency, low frequency, medium frequency, high frequency, very high frequency, ultra-high frequency, super-high frequency, terahertz broadcasts, etc.); Ethernet; X.25; power-line-type networking, e.g., Powerline audio video Ethernet, etc.; femtocell technology; WI FI; worldwide interoperability for microwave access; enhanced general packet radio service; third generation partnership project, long term evolution; third generation partnership project universal mobile telecommunications system; third generation partnership project 2, ultra mobile broadband; high speed packet access; high speed downlink packet access; high speed uplink packet access; enhanced data rates for global system for mobile communication evolution radio access network; universal mobile telecommunications system terrestrial radio access network; or long term evolution advanced.

The term "infer" or "inference" can generally refer to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference, for example, can be employed to identify a specific context or action, or can generate a probability distribution over states of interest based on a consideration of data and events. Inference can also refer to techniques employed for composing higher-level events from a set of events and/or data. Such inference results in the construction of new events or actions from a set of observed events and/or stored event data, whether the events, in some instances, can be correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
    a processor; and
    a memory that stores executable instructions that, when executed by the processor, facilitate performance of operations, comprising:
        in response to obtaining a first characteristic of a wireless network comprising network devices, determining a first low density parity check forward error correcting code based on the first characteristic; and
        employing the first low density parity check forward error correcting code in a first communication between a first user equipment and a radio access network device of the network devices, wherein the employing the first low density parity check forward error correcting code comprises altering the first communication to stop carrying error correcting bits according to a second low density parity check forward error correcting code and to start carrying the error correcting bits according to the first low density parity check forward error correcting code.

2. The system of claim 1, wherein the second low density parity check forward error correcting code is communicated via a first communication channel between the first user equipment and the radio access network device.

3. The system of claim 2, wherein the first low density parity check forward error correcting code is communicated via the first communication channel between the first user equipment and the radio access network device.

4. The system of claim 2, wherein the first low density parity check forward error correcting code is communicated via a second communication channel between the first user equipment and the radio access network device.

5. The system of claim 1, wherein the first characteristic is a coding rate.

6. The system of claim 5, wherein the coding rate is indicated in a modulation and coding scheme table.

7. The system of claim 1, wherein the first characteristic is a payload size of data to be carried between the first user equipment and the radio access network device according to the first low density parity check forward error correcting code.

8. The system of claim 1, wherein the operations further comprise:
    obtaining a second characteristic of the wireless network comprising the network devices;
    determining a third forward error correcting code based on the second characteristic; and
    employing the third forward error correcting code in a second communication between a second user equipment and the radio access network device, wherein the first forward error correcting code and the third forward error correcting code are different forward error correcting codes, and wherein the employing the first forward error correcting code and the employing the third forward error correcting code occur concurrently.

9. The system of claim 1, wherein the first communication is a downlink communication.

10. The system of claim 1, wherein the first communication is an uplink communication.

11. A method, comprising:
    determining, by a device of network devices of a wireless network, a first low density parity check forward error correcting code based on a first characteristic of the network devices; and
    applying, by the eNodeB device, the first low density parity check forward error correcting code to a first communication channel between a first user equipment and the eNodeB device, wherein the applying comprises altering the first communication channel to carrying error correcting bits using the first low density parity check forward error correcting code in lieu of carrying the error correcting bits using a second low density parity check forward error correcting code.

12. The method of claim 11, further comprising:
    determining, by the device, a third low density parity check forward error correcting code based on a second characteristic of the network devices; and applying, by the device, the third low density parity check forward error correcting code to a second communication channel between a second user equipment and the device.

13. The method of claim 12, wherein the first low density parity check forward error correcting code and the third low density parity check forward error correcting code are different forward low density parity check error correcting codes.

14. The method of claim 11, wherein the determining the first low density parity check forward error correcting code is based on a coding rate indicated in a modulation and coding scheme table.

15. The method of claim 11, wherein the device is an eNodeB device, wherein the determining the first low density parity check forward error correcting code is based on a payload size of data to be carried between the first user equipment and the eNodeB device according to the first low density parity check forward error correcting code.

16. A non-transitory machine-readable medium, comprising executable instructions that, when executed by a processor, facilitate performance of operations, comprising:
in response to determining a first characteristic of a wireless network, selecting a first low density parity check forward error correcting code based on the first characteristic; and
including first error correcting bits according to the first low density parity check forward error correcting code on a first communication channel between a first user equipment and a radio access network device of the wireless network, wherein the including the first error correcting bits comprises altering the first communication channel to stop carrying second error correcting bits according to a second low density parity check forward error correcting code and to start carrying the first error correcting bits according to the first low density parity check forward error correcting code.

17. The non-transitory machine-readable medium of claim 16, wherein the operations further comprise:
in response to determining a second characteristic of the wireless network, selecting a third low density parity check forward error correcting code based on the second characteristic; and
including third error correcting bits according to the third low density parity check forward error correcting code on a second communication channel between a second user equipment and the radio access network device.

18. The non-transitory machine-readable medium of claim 17, wherein the first low density parity check forward error correcting code is different from the third low density parity check forward error correcting code.

19. The non-transitory machine-readable medium of claim 16, wherein the selecting the first low density parity check forward error correcting code is based on a coding rate indicated in a modulation and coding scheme table and a payload size of data to be carried between the first user equipment and the radio access network device according to the first low density parity check forward error correcting code.

20. The non-transitory machine-readable medium of claim 16, wherein the first communication channel is selected from a group of channels comprising an uplink communication channel and a downlink communication channel.

* * * * *